United States Patent
Oshima et al.

(10) Patent No.: US 6,331,815 B1
(45) Date of Patent: Dec. 18, 2001

(54) DUAL-FREQUENCY MATCHING CIRCUIT

(75) Inventors: Takeshi Oshima; Hiromitsu Uchida; Yasushi Itoh, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/352,793

(22) Filed: Jul. 14, 1999

(30) Foreign Application Priority Data

Aug. 28, 1998 (JP) .................................................. 10-243989

(51) Int. Cl.$^7$ .................................................. H04M 11/04
(52) U.S. Cl. .................................. 340/310.05; 340/310.01; 333/17.3; 333/32; 333/124; 343/822; 326/30
(58) Field of Search ........................ 340/310.05, 310.01; 333/32, 17.3, 124; 343/822; 326/30

(56) References Cited

U.S. PATENT DOCUMENTS

| | | | |
|---|---|---|---|
| 1,965,649 | * | 7/1934 | Jaumann ................................. 333/32 |
| 2,184,771 | * | 12/1939 | Roosenstein ............................ 333/32 |
| 2,315,170 | * | 3/1943 | Weel ..................................... 333/32 |
| 2,835,872 | * | 5/1958 | Pierce ................................... 333/32 |

FOREIGN PATENT DOCUMENTS

| | | |
|---|---|---|
| 4626081 | 9/1971 | (JP) . |
| 5429949 | 3/1979 | (JP) . |
| 58178617 | 10/1983 | (JP) . |
| 63102512 | 5/1988 | (JP) . |
| 5121988 | 5/1993 | (JP) . |
| 5206888 | 8/1993 | (JP) . |
| 6244756 | 9/1994 | (JP) . |
| 6252791 | 9/1994 | (JP) . |
| 9629756 | 9/1996 | (WO) . |

OTHER PUBLICATIONS

Nakajima, H., et al., "Dual–Frequency Matching Technique Using . . . MMIC Amplifier", Proceedings of the 1997 IEICE General Conf., Mar. 24–27, 1997, Kansai University, Suita, The Institute of Electronics, Information and Communication Engineers.

Nakajima, H., et al., "Dual–Frequency Matching Technique and its Application to an Octave–Band (30–60 GHz) MMIC Amplifier", IEICE Trans. Electron., vol. E80–C, No. 12, Dec. 1997, pp. 1614–1621.

* cited by examiner

*Primary Examiner*—Nina Tong
(74) *Attorney, Agent, or Firm*—Rothwell, Figg, Ernst & Manbeck

(57) ABSTRACT

A dual-frequency matching circuit of the present invention comprises an output terminal to which a load is connected, an input terminal through which an input signal is input to the load, a series resonance circuit, which is composed of a series capacitor and a series inductor connected in series to the series capacitor and disposed in such a manner that it is connected in series to the load when observed from the input terminal side, and a parallel resonance circuit, which is composed of a parallel capacitor and a parallel inductor connected in parallel to the parallel capacitor, and disposed in such a manner that it is connected in parallel to the entire portion of the load and the series resonance circuit when observed from the input terminal side. By this configuration, the problem contained in the conventional matching circuit that the matching of impedance at two arbitrary different frequencies is not made possible can be solved, and that since no transmission line is needed therein, the circuit can be minimized as a whole when frequency at which the matching operation is performed is set to a low frequency band.

17 Claims, 4 Drawing Sheets

DUAL-FREQUENCY MATCHING CIRCUIT

BACKGROUND OF THE INVENTION

1. Field of the Invention

The present invention relates to a dual-frequency matching circuit that enables impedance matching at two separate frequencies simultaneously, and more particularly to an improvement of the matching circuit that can be suitably used in the microwave band.

2. Description of the Related Art

FIG. 9 is a schematic diagram showing a conventional dual-frequency matching circuit cascaded with a field-effect transistor (hereinafter referred to as just as an "FET", or an "FET transistor"), as disclosed in the "Dual-frequency matching technique and its application to an octave-band (30–60 GHz) MMIC amplifier" by NAKAJIMA, M, MURAGUCHI, in IEICE TRANS, ELECTRON., VOL.E80-C, No. 12, December 1997.

In the figure, reference numeral 1 denotes an input terminal of the matching circuit, numeral 2 denotes an output terminal of the matching circuit, numeral 47 denotes a transmission line provided between the input terminal 1 and the output terminal 2, numeral 48 denotes a shorted stub provided between the input terminal 1 and the transmission line 47, the length of which is a quarter-wavelength $\lambda/4$ at a high angular frequency $\omega_H$, numeral 49 denotes an open stub provided between the input terminal 1 and the transmission line 47, and reference numeral 50 denotes an FET transistor, the gate of which is connected to the output terminal 2.

FIG. 10 denotes a Smith Chart for explaining the matching method in the conventional dual-frequency matching circuit. In the figure, reference numeral 51 denotes a load impedance generated in a case that a low-frequency signal $f_L$ is applied to the FET transistor 50, reference numeral 52 denotes an impedance generated in a case that a high-frequency signal $f_H$ is applied to the FET transistor 50, and reference numeral 53 denotes a constant conductance circle (a constant conductance circle of 0.02 S, for example).

First, by setting the length of the transmission line 47 to a predetermined length, the two impedances of the above-mentioned FET transistor are set on to the constant conductance circle 53. Reference numeral 54 denotes a thus obtained transformed impedance of the case that the low-frequency signal $f_L$ is applied, whereas the reference numeral 55 denotes a transformed impedance of the case that the high-frequency signal $f_H$ is applied.

Thereafter, by setting the length of the open stub 49 to a predetermined length, the above-mentioned two impedances are shifted along the constant conductance circle 53 so as to be matched with each other, and reference numeral 56 denotes a point at which they are matched. In this way, the conventional matching circuit enables an impedance matching at two separate frequencies $f_L$ and $f_H$.

The operation of the above conventional dual-frequency matching circuit is as follows.

When a signal is to be input through the input terminal 1 to the EET transistor 50, no reflected wave due to the input signal is generated at the above two matching frequencies $f_L$ and $f_H$.

Since the conventional dual-frequency matching circuit is configured as such, two input impedances of the FET transistor 50 at two different frequencies are transformed on to the constant conductance circle 53 only on the basis of the length of the transmission line 47, so that if the length of the transmission line 47 is determined in such a manner that an impedance at one of the two frequencies is shifted on to the constant conductance circle 53, the other frequency at which the impedance can be shifted on to the constant conductance circle 53 is automatically determined, so that there has been a problem that the matching of impedances at two arbitrarily selected frequencies is not made possible.

Further, as a transmission line 47 is adopted in the conventional dual-frequency matching circuit, if the matching is to be performed in a low-frequency band, a considerably long transmission line is required, so that the size of the frequency-matching circuit as a whole is also made too large.

SUMMARY OF THE INVENTION

The present invention has been proposed to solve the problems aforementioned, and it is an object of the present invention to provide a matching circuit capable of performing an impedance matching at two arbitrary frequencies.

In order to achieve the above object, the dual-frequency matching circuit according to the first aspect of the present invention is constructed such that it comprises an output terminal to which a load is connected, an input terminal through which an input signal is input to the load, a series resonance circuit, which is composed of a series capacitor and a series inductor connected in series to the series capacitor, and disposed in such a manner as to be connected in series to the load when observed from the input terminal side, and a parallel resonance circuit, which is composed of a parallel capacitor and a parallel inductor connected in parallel to the parallel capacitor, and disposed in such a manner as to be connected in parallel to the entire portion of the series resonance circuit and the load when observed from the input terminal side.

In the dual-frequency matching circuit constructed as above, on condition that the load connected to the output terminal is formed by a load resistor and a load capacitor mutually connected in series, and that the resistance of the load resistance is $R_i$, the capacitance of the load capacitor is $C_{gs}$, two matching angular frequencies are $\omega_L$ and $\omega_H$, respectively, and matching admittance is $Y_0$, the inductance $L_1$ of the series inductor, the capacitance $C_1$ of the series capacitor, the inductance $L_2$ of the parallel inductor and the capacitance $C_2$ of the parallel capacitor are set in such a manner as to satisfy the following Formulae 1:

$L_1 = X_g/(\omega_H - \omega_L)$ $C_1 = (\omega_H - \omega_L) * C_{gs}/(C_{gs} * \omega_H * \omega_L * X_g - (\omega_H - \omega_L))$ $L_2 = (\omega_H - \omega_L) * R_i/(\omega_H * \omega_L * Y_o * X_g)$ $C_2 = Y_o * X_g/((\omega_H - \omega_L) * R_i)$ $X_g = (R_i/Y_0 - R_i * R_i)^{1/2}$     (Formulae 1)

The dual-frequency matching circuit according to the second aspect of the present invention is constructed such that it comprises an output terminal to which a load is connected, an input terminal through which an input signal is input to the load, a parallel resonance circuit, which is composed of a parallel capacitor and a parallel inductor connected in parallel to the parallel capacitor, and disposed in such a manner as to be connected in series to the load when observed from the input terminal side, and a series resonance circuit, which is composed of a series capacitor and a series inductor connected in series to the series capacitor, and disposed as being connected in parallel to the load when observed from the input terminal side.

In the dual-frequency matching circuit constructed as above, the load connected to the output terminal is formed by a load resistor and a load capacitor mutually connected in series, wherein on condition that the resistance of the load resistance is $R_i$, the resistance of the load capacitor is $C_{gs}$, two matching angular frequencies are $\omega_L$ and $\omega_H$, respectively, and matching impedance is $Z_0$, the inductance $L_1$ of the series inductor, the capacitance $C_1$ of the series capacitor, the inductance $L_2$ of the parallel inductor, and the capacitance $C_2$ of the parallel capacitor are set in such a manner as to satisfy the following Formulae 2:

$$L_1 = (\omega_H^*(\beta_L - B_{gL}) - \omega_L^*(\beta_H + B_{gH}))/((\omega_H^* \omega_H - \omega_L^* \omega_L)(\beta_L - B_{gL})(\beta_H + B_{gH}))$$

$$C_1 = (\omega_H^* \omega_H - \omega_L^* \omega_L)(\beta_L - B_{gL})(\beta_H + B_{gH})/(\omega_H^* \omega_L^*(\omega_L^*(\beta_L - B_{gL}) - \omega_H^*(\beta_H + B_{gH})))$$

$$L_2 = Z_o^*(\omega_H^* \omega_H - \omega_L^* \omega_L)^* B_{gH}^* B_{gL}/(\omega_H^* \omega_L^*(\omega_H^* \alpha_L^* B_{gH} + \omega_L^* \alpha_H^* B_{gL}))$$

$$C_2 = (\omega_L^* \alpha_L^* B_{gH} + \omega_H^* \alpha_H^* B_{gL})/(Z_o^*(\omega_H^* \omega_H - \omega_L^* \omega_L)^* B_{gH}^* B_{gL})$$

$$\alpha = R_i/(R_i^* R_i + 1/(\omega^* \omega^* C_{gs}^* C_{gs}))$$

$$\beta = (1/(\omega^* C_{gs}))/(R_i^* R_i + 1/(\omega^* \omega^* C_{gs}^* C_{gs}))$$

$$B_g = (\alpha/Z_o - \alpha^* \alpha)^{1/2} \quad \text{(Formulae 2)}$$

The dual-frequency matching circuit according to the third aspect of the present invention is constructed such that it comprises an input terminal to which a load is connected, an output terminal that outputs an output signal on the basis of the load, a series resonance circuit, which is composed of a series capacitor and a series inductor connected in series to the series capacitor, and disposed in such a manner as to be connected in series to the load when observed from said output terminal side, and a parallel resonance circuit, which is composed of a parallel capacitor and a parallel inductor connected in parallel to the parallel capacitor, and disposed in such a manner as to be connected in parallel to the load when observed from the output terminal side.

In the dual-frequency matching circuit constructed as above, on condition that the load connected to the input terminal is formed by a load capacitor and a load resistor mutually connected in parallel, one end of the both of which being connected to the input terminal in series, and that the resistance of the load resistance is $R_{ds}$, the capacitance of the load capacitor is $C_{ds}$, two matching angular frequencies are $\omega_L$ and $\omega_H$, respectively, and matching impedance is $Z_0$, the inductance $L_1$ of the series inductor, the capacitance $C_1$ of the series capacitor, the inductance $L_2$ of the parallel inductor, and the capacitance $C_2$ of the parallel capacitor are set in such a manner as to satisfy the following Formulae 3:

$$L_1 = R_{ds}^* Z_o^* B_d/(\omega_H - \omega_L)$$

$$C_1 = (\omega_H - \omega_L)/(\omega_H^* \omega_L^* R_{ds}^* Z_o^* B_d)$$

$$L_2 = (\omega_H - \omega_L)/(\omega_H^* \omega_L^* B_d)$$

$$C_2 = B_d/(\omega_H - \omega_L) - C_{ds}$$

$$B_d = (1/(Z_o^* R_{ds}) - 1/(R_{ds}^* R_{ds}))^{1/2} \quad \text{(Formulae 3)}$$

The dual-frequency matching circuit according to the fourth aspect of the present invention is constructed such that it comprises an input terminal to which a load is connected, an output terminal that outputs an output signal on the basis of the load, a parallel resonance circuit, which is composed of a parallel capacitor and a parallel inductor connected in parallel with the parallel capacitor, and disposed in such a manner as to be connected in series to the load when observed from the output terminal side, and a series resonance circuit, which is composed of a series capacitor and a series inductor connected in series to the series capacitor, and disposed as being connected in parallel to the entire portion of the load and the parallel resonance circuit when observed from the output terminal side.

In the dual-frequency matching circuit constructed as above, on condition that the load connected to the input terminal is formed by a load capacitor and a load resistor mutually connected in parallel, one end of the both of which being connected to the input terminal in series, and that the resistance of the load resistance is $R_{ds}$, the capacitance of the load capacitor is $C_{ds}$, two matching angular frequencies are $\omega_L$ and $\omega_H$, respectively, and matching impedance is $Z_0$, the inductance $L_1$ of the series inductor, the capacitance $C_1$ of the series capacitor, the inductance $L_2$ of the parallel inductor, and the capacitance $C_2$ of the parallel capacitor are set in such a manner as to satisfy the following Formulae 4:

$$L_1 = (\omega_L^* \alpha_L^* X_{dH} + \omega_H^* \alpha_H^* X_{dL})/(Y_o^*(\omega_H^* \omega_H - \omega_L^* \omega_L)^* X_{dH}^* X_{dL})$$

$$C_1 = Y_o^*(\omega_H^* \omega_H - \omega_L^* \omega_L)^* X_{dH}^* X_{dL}/(\omega_H^* \omega_L^*(\omega_H^* \alpha_L^* X_{dH} + \omega_L^* \alpha_{dL}^* X_{dL}))$$

$$L_2 = (\omega_H^* \omega_H - \omega_L^* \omega_L)/(\omega_H^* \omega_L^*(\omega_L/(X_{dH} - \beta_H) + \omega_H/(X_{dL} + \beta_L)))$$

$$C_2 = (\omega_H^*(X_{dH} - \beta_H) + \omega_L/(X_{dL} + \beta_L))/(\omega_H^* \omega_H - \omega_L^* \omega_L)$$

$$\alpha = (1/R_{ds})/(1/(R_{ds}^* R_{ds}) + \omega^* \omega^* C_{ds}^* C_{ds})$$

$$\beta = \omega^* C_{ds}/(1/(R_{ds} R_{ds}) + \omega^* \omega^* C_{ds}^* C_{ds}))$$

$$X_d = (\alpha/Y_o - \alpha^* \alpha)^{1/2} \quad \text{(Formulae 4)}$$

DETAILED DESCRIPTION OF THE PREFERRED EMBODIMENTS

Several embodiments of the present invention are now explained as in the followings.

First Embodiment

Figure 1:
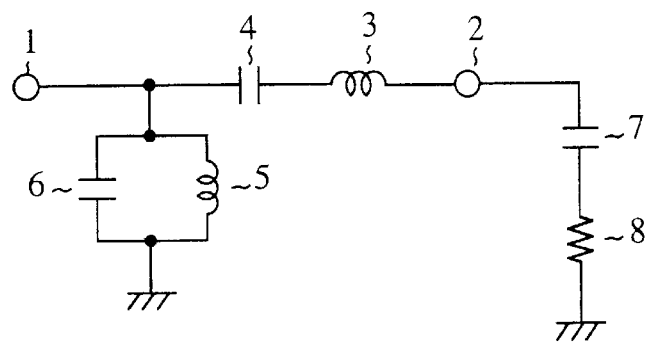
FIG. 1 is a schematic diagram showing a dual-frequency matching circuit according to the first embodiment of the present invention and a load connected thereto.

FIG. 1 is a schematic diagram showing a dual-frequency matching circuit and a load connected thereto according to a first embodiment of the present invention.

In the figure, reference numeral 1 denotes an input terminal of the matching circuit, numeral 2 denotes an output terminal of the matching circuit, numeral 3 denotes a series inductor connected between the input terminal 1 and the output terminal 2, numeral 4 denotes a series capacitor connected between the series inductor 3 and the input terminal 1, numeral 5 denotes a parallel inductor whose one end is connected between the series capacitor 4 and the input terminal 1, while the other end thereof is connected to the ground potential, and reference numeral 6 denotes a parallel capacitor whose one end is connected between the series capacitor 4 and the input terminal 1, while the other end thereof is connected to the ground potential.

Further, reference numeral 7 denotes a load capacitor, one end of which is connected to the output terminal 2, and numeral 8 denotes a load resistance, one end of which is connected to the other end of the load capacitor 7, while the other end thereof is connected to the ground potential. It should be noted that in the following explanation of the present embodiment, the load resistance 8 is regarded as being smaller than the matching impedance (for example of 50 Ω generally used for a transmission line of a microwave). Further, note that if an equivalent circuit is to be replaced for a circuit in which the load capacitor 7 and the load resistance 8 are connected in series, a circuit, in which an FET transistor whose source electrode is grounded is used in the microwave band, can be represented as an equivalent circuit when observed from the gate electrode of the FET transistor.

Figure 2:
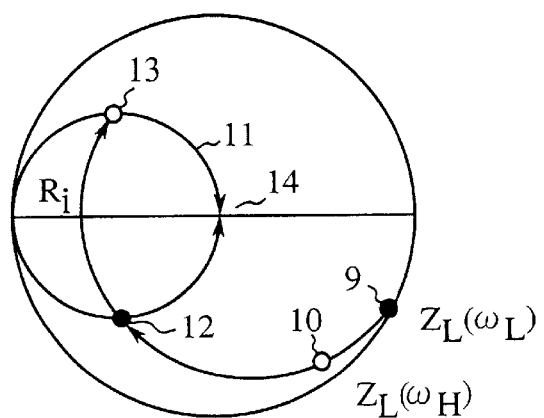
FIG. 2 is a Smith Chart for explaining the role of each of the circuit elements when the matching operation at two angular frequencies $\omega_H$ and $\omega_L$ are carried out in the dual-frequency matching circuit of the first embodiment.

FIG. 2 is a Smith Chart for explaining the role of each of the circuit elements shown in FIG. 1 such as the series inductor 3, the series capacitor 4, the parallel inductor 5, and the parallel capacitor 6, when performing an impedance matching operation at two angular frequencies $\omega_H$ and $\omega_L$ in the dual-frequency matching circuit according to the first embodiment.

In FIG. 2, reference numeral 9 denotes a load impedance $Z_L(\omega_L)$ in a case that a signal of low angular frequency $\omega_L$ is applied to the load resistance 8 and the load capacitor 7, reference numeral denotes a load impedance $Z_L(\omega_H)$ in a case that a signal of high angular frequency $\omega_H$ is applied to the load resistance 8 and the load capacitor 7, and reference numeral 11 denotes a constant conductance circle (a constant conductance circle of 0.02 S, for example), which is regulated by the above matching impedance.

Here, it is arranged such that the series resonance circuit formed by the series inductor 3 and the series capacitor 4 becomes inductive at two angular frequencies, and that due to this the conductance component of the admittance, which is obtained by observing from the input terminal 1 side the series resonance circuit formed by these circuit elements 3 and 4, and the total load formed by the load capacitor 7 and the load resistance 8 at two different angular frequencies $\omega_H$ and $\omega_L$, is shifted on to the constant conductance circle 11. Reference numeral 12 denotes a thus obtained transformed impedance of the case in which a signal of low angular frequency $\omega_L$ is applied, whereas numeral 13 denotes a transformed impedance of the case in which a high angular frequency $\omega_H$ is applied, which is also obtained by this operation. The value of the inductance $L_1$ of the series inductor and that of the capacitance $C_1$ of the series capacitor are shown in the Formulae 5 below.

Further, it is arranged such that the parallel resonance circuit formed by the parallel inductor 5 and the parallel capacitor 6 becomes inductive at a low angular frequency $\omega_L$, and capacitive at a high angular frequency $\omega_H$, and that the two impedances are, due to this, shifted along the constant conductance circle 11 so as to be matched with each other. Reference numeral 14 denotes a matching point obtained by this matching operation. The value of the inductance $L_2$ of the parallel inductor and that of the capacitance $C_2$ of the parallel capacitor are shown also in the Formulae 5 below.

$$L_1 = X_g/(\omega_H - \omega_L)$$

$$C_1 = (\omega_H - \omega_L) * C_{gs}/(C_{gs} * \omega_H * \omega_L * X_g - (\omega_H - \omega_L))$$

$$L_2 = (\omega_H - \omega_L) * R_i/(\omega_H * \omega_L * Y_o * X_g)$$

$$C_2 = Y_o * X_g/((\omega_H - \omega_L) * R_i)$$

$$X_g = (R_i/Y_o - R_i * R_i)^{1/2} \quad \text{(Formulae 5)}$$

As is obvious from the Formulae 5, the two matching angular frequencies $\omega_L$, $\omega_H$ can be set as individually separate angular frequencies from each other.

The operation of the matching circuit according to the present invention is as follows.

When a signal is to be input through the input terminal 1 to the load, no reflected wave due to the input signal is generated at the two matching angular frequencies $\omega_L$ and $\omega_H$.

As explained hereinabove, since according to the first embodiment of the present invention, an impedance matching operation is performed by a dual-frequency matching circuit which is configured as comprising the output terminal 2 to which the loads 7 and 8 are connected, the input terminal 1 through which an input signal to the loads 7 and 8 is input, and the series resonance circuit, which is composed of the series capacitor 4 and the series inductor 3 connected to the series capacitor 4 and disposed in such a manner that it is connected in series to the loads 7 and 8 when observed from the input terminal 1 side, and the parallel resonance circuit, which is composed of the parallel capacitor 6 and the parallel inductor 5 connected in parallel to the parallel capacitor 6, and disposed in such a manner that it is connected in parallel to the entire portion of the loads 7 and 8 and the series resonance circuit formed by the capacitor 4 and the inductor 3 when observed from the input terminal 1 side, the matching operation can be performed with an input resistance (Ri) of the loads 7 and 8 which is smaller than the matching impedance at arbitrarily selected two frequencies.

Particularly, on condition that the resistance of the load resistance 8 is Ri, the capacitance of the load capacitor 7 is $C_{gs}$, two matching angular frequencies are $\omega_L$ and $\omega_H$, and the matching admittance is $Y_o$, since the inductance $L_1$ of the series inductance, the capacitance $C_1$ of the series capacitor, the inductance $L_2$ of the parallel inductor, and the capacitance $C_2$ of the parallel capacitor are set in such a manner as to satisfy the above Formulae 5, the matching operation can be performed optimally at the target matching impedance value.

Further, since there is no need to use a transmission line as one of the matching elements, even though the frequency at which the matching operation is performed is set to a low frequency band, a considerably long transmission line is no longer needed, so that the circuit can be minimized when applied in the low frequency band.

Second Embodiment

Figure 3:
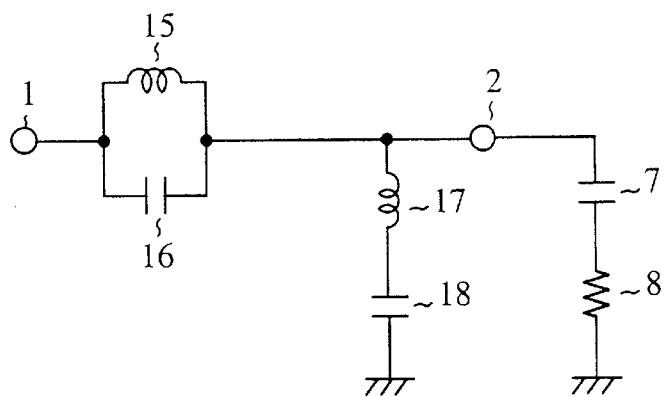
FIG. 3 is a schematic diagram showing a dual-frequency matching circuit according to the second embodiment of the present invention and a load connected thereto.

FIG. 3 is a schematic diagram showing a dual-frequency matching circuit and a load connected thereto according to a second embodiment of the present invention.

In the figure, reference numeral 15 denotes a parallel inductor provided between the input terminal 1 and the output terminal 2, numeral 16 denotes a parallel capacitor provided between the input terminal 1 and the output terminal 2, numeral 17 denotes a series inductor whose one end is connected between the output terminal 2 and the parallel inductor 15, numeral 18 denotes a series capacitor whose one end is connected to the other end of the series inductor 17, while the other end thereof is connected to the ground potential. Other portions are same as those of the first embodiment, so that the detailed explanation thereabout is omitted here by simply putting the same reference numerals.

It should be noted that in the following explanation of the present embodiment, the load resistance 8 is regarded as being smaller than the matching impedance (for example of 50 Ω generally used for a transmission line of a microwave).

Figure 4:
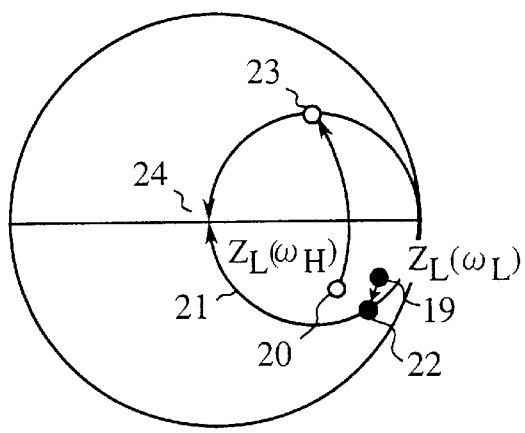
FIG. 4 is a Smith Chart for explaining the role of each of the circuit elements when the matching operation at two angular frequencies $\omega_H$, $\omega_L$ are carried out in the dual-frequency matching circuit of the second embodiment.
Figure 5:
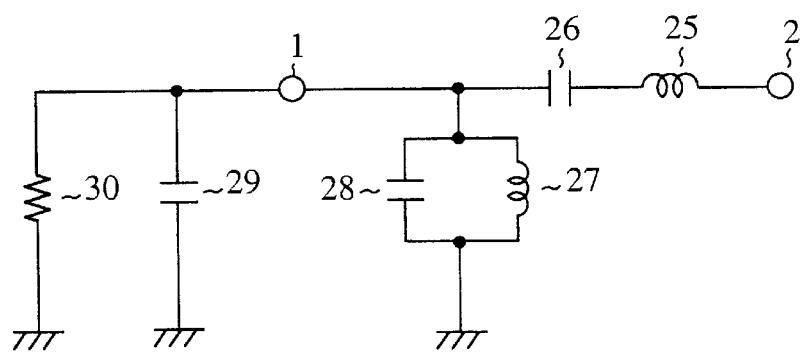
FIG. 5 is a schematic diagram showing a dual-frequency matching circuit according to the third embodiment of the present invention and a load connected thereto.

FIG. 4 is a Smith Chart for explaining the role of each of the circuit elements shown in FIG. 5, such as the series inductor 17, the series capacitor 18, the parallel inductor 15 and the parallel capacitor 16 when performing an impedance matching operation at two angular frequencies $\omega_H$ and $\omega_L$ in the dual-frequency matching circuit according to the second embodiment.

In FIG. 4, reference numeral 19 denotes a load impedance $Z_L(\omega_L)$ in a case that a low angular frequency signal $\omega_L$ is applied to the load resistance 8 and the load capacitor 7, reference numeral 20 denotes a load impedance $Z_L(\omega_H)$ in a case that a high angular frequency signal $\omega_H$ is applied to the load resistance 8 and the load capacitor 7, and reference numeral 21 denotes a constant resistance circle (a constant resistance circle of 50 Ω, for example), which is regulated by the matching impedance.

Here, it is arranged such that the series resonance circuit formed by the series inductor 17 and the series capacitor 18 becomes inductive at a low angular frequency $\omega_L$ and capacitive at a high angular frequency $\omega_H$, and that the two impedances are, due to this, shifted on to the constant resistance circle 21. Reference numeral 22 denotes a thus obtained transformed impedance of the case that signal of a low angular frequency $\omega_L$ is applied, whereas reference numeral 23 denotes a transformed impedance of the case that a signal of high angular frequency $\omega_H$ is applied, which is also obtained by this operation. The value of the inductance $L_1$ of the series inductor and that of the capacitance $C_1$ of the series capacitor are shown in the Formulae 6 below.

Further, it is arranged such that the parallel resonance circuit formed by the parallel inductor 15 and the parallel capacitor 16 becomes inductive at a low angular frequency $\omega_L$, and capacitive at a high angular frequency $\omega_H$, and that the two impedances are, due to this, shifted along the constant resistance circle 21 so as to be matched with each other. Reference numeral 24 denotes a matching point obtained by this matching operation. The value of the inductance $L_2$ of the parallel inductor and that of the capacitance $C_2$ of the parallel capacitor are shown also in the Formulae 6 below.

$$L_1=(\omega_H*(\beta_L-B_{gL})-\omega_L*(\beta_H+B_{gH}))/((\omega_H*\omega_H-\omega_L*\omega_L)(\beta_L-B_{gL})(\beta_H+B_{gH}))$$

$$C_1=(\omega_H*\omega_H-\omega_L*\omega_L)(\beta_L-B_{gL})(\beta_H+B_{gH})/(\omega_H*\omega_L*(\omega_L*(\beta_L-B_{gL})-\omega_H*(\beta_H+B_{gH})))$$

$$L_2=Z_o*(\omega_H*\omega_H-\omega_L*\omega_L)*B_{gH}*B_{gL}/(\omega_H*\omega_L*(\omega_H*\alpha_L*B_{gH}+\omega_L*\alpha_H*B_{gL}))$$

$$C_2=(\omega_L*\alpha_L*B_{gH}+\omega_H*\alpha_H*B_{gL})/(Z_o*(\omega_H*\omega_H-\omega_L*\omega_L)*B_{gH}*B_{gL})$$

$$\alpha=(R_i/R_i*R_i+1/(\omega*\omega*C_{gs}*C_{gs}))$$

$$\beta=(1/(\omega*C_{gs}))/(R_i*R_i+1/(\omega*\omega*C_{gs}*C_{gs}))$$

$$B_g=(\alpha/Z_o-\alpha*\alpha)^{1/2} \qquad \text{(Formulae 6)}$$

As is obvious from the Formulae 6, the two matching angular frequencies $\omega_L$ and $\omega_H$ can be set as individually separate angular frequencies from each other.

The operation of the matching circuit according to the present invention is equivalent to that of the first embodiment, so that the detailed explanation thereof is omitted here.

As explained hereinabove, since according to the second embodiment of the present invention, an impedance matching operation is performed by a dual-frequency matching circuit which is configured as comprising the output terminal 2 to which the loads 7 and 8 are connected, an input terminal 1 through which an input signal to the loads 7 and 8 is input, the parallel resonance circuit, which is composed of the parallel capacitor 16 and the parallel inductor 15 connected to the parallel capacitor 16, and disposed in such a manner that it is connected in series to the loads 7 and 8 when observed from the input terminal 1 side, and a series resonance circuit, which is composed of a series capacitor 18 and a series inductor 17 connected in series to the series capacitor 18, and disposed in such a manner that it is connected in parallel to the loads 7 and 8 when observed from the input terminal 1 side, the matching operation can be performed with an input resistance ($R_i$) of the loads 7 and 8 which is larger than the matching impedance at arbitrarily selected two frequencies.

Particularly, on condition that the resistance of the load resistance 8 is Ri, the capacitance of the load capacitor 7 is $C_{gs}$, two matching angular frequencies are $\omega_L$ and $\omega_H$, respectively, and the matching impedance is $Z_0$, since the inductance $L_1$ of the series inductor, the capacitance $C_1$ of the series capacitor, the inductance $L_2$ of the parallel inductor, and the capacitance $C_2$ of the parallel capacitor are set in such a manner as to satisfy the above Formulae 6, the matching operation can be performed optimally at the target matching impedance value.

Further, since there is no need to use a transmission line as each of the inductor 15 and 17, even though the frequency at which the matching operation is performed is set to a low frequency band, a considerably long transmission line is no longer needed, so that the circuit can be minimized when applied in the low frequency band.

Third Embodiment

FIG. 5 is a schematic diagram showing a dual-frequency matching circuit and a load connected thereto according to a third embodiment of the present invention and a load therein.

In the figure, reference numeral 25 denotes a series inductor connected between the input terminal 1 and the output terminal 2, numeral 26 denotes a series capacitor provided between the serial inductor 25 and the input terminal 1, numeral 27 denotes a parallel inductor whose one end is connected between the series capacitor 26 and the input terminal 1, while the other end thereof is connected to the ground potential, and numeral 28 denotes a parallel capacitor whose one end is connected between the series capacitor 26 and the input terminal 1, while the other end thereof is connected to the ground potential.

Further, reference numeral 29 denotes a load capacitor whose one end is connected to the input terminal 1, while the other end is connected to the ground potential, and numeral 30 denotes a load resistor whose one end is connected to the input terminal 1, while the other end is connected to the ground potential.

It should be noted that in the following explanation of the present embodiment the load resistance 30 is regarded as being larger than the matching impedance (for example of 50 Ω generally used for a transmission line of a microwave). Further, note that if an equivalent circuit is to be replaced for a circuit in which the load capacitor 29 and the load resistance 30 are connected in parallel, a circuit, in which an FET transistor whose source electrode is grounded is used in the microwave band, can be represented as an equivalent circuit when observed from the drain electrode of the FET transistor. Other portions are same as those of the first embodiment, so that the detailed explanation thereabout is omitted here by simply putting the same reference numerals.

Figure 6:
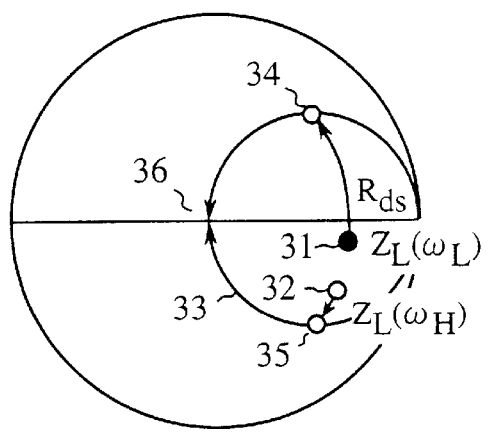
FIG. 6 is a Smith Chart for explaining the role of each of the circuit elements when the matching operation at two angular frequencies $\omega_H$ and $\omega_L$ are carried out in the dual-frequency matching circuit of the third embodiment.

FIG. 6 is a Smith Chart for explaining the role of each of the circuit elements as shown in FIG. 5, such as the series inductor 25, the series capacitor 26, the parallel inductor 27 and the parallel capacitor 28 when performing an impedance matching operation at two angular frequencies $\omega_H$ and $\omega_L$ in the dual-frequency matching circuit according to the third embodiment.

In FIG. 5, reference numeral 31 denotes a load impedance $Z_L(\omega_L)$ in a case that a signal of low angular frequency $\omega_L$ is applied to the load resistance 30 and the load capacitor 29, reference numeral 32 denotes a load impedance $Z_L(\omega_H)$ in a case that a signal of high angular frequency signal $\omega_H$ is applied to the load resistance 30 and the load capacitor 29, and reference numeral 33 denotes a constant resistance circle (a constant resistance circle of 50 Ω, for example), which is regulated by the matching impedance.

Here, it is arranged such that the parallel resonance circuit formed by the parallel inductor 27 and the parallel capacitor 28 becomes inductive at a low angular frequency $\omega_L$ and capacitive at a high angular frequency $\omega_H$, and that due to this the admittance, which is obtained by observing from the output terminal 2 side the parallel resonance circuit and the load, is shifted on to the constant resonance circle 33. Reference numeral 34 denotes a thus obtained transformed impedance of the case in which a signal of low angular frequency $\omega_L$ is applied, whereas numeral 35 denotes a transformed impedance of the case in which a signal of high angular frequency $\omega_H$ is applied, which is also obtained by this operation. The value of the inductance $L_2$ of the parallel inductor 27 and that of the capacitance $C_1$ of the parallel capacitor 28 are shown in the Formulae 7 below.

Further, it is arranged such that the series resonance circuit formed by the series inductor 25 and the series capacitor 26 becomes inductive at a low angular frequency $\omega_L$ and capacitive at a high angular frequency $\omega_H$, and that the two impedances are, due to this, shifted along the constant resistance circle 33 so as to be matched with each other. Reference numeral 36 denotes a matching point obtained by this matching operation. The value of the inductance $L_1$ of the series inductor and that of the capacitance $C_1$ of the series capacitor are shown also in the Formulae 7 below.

$$L_1 = R_{ds} * Z_o * B_d / (\omega_H - \omega_L)$$

$$C_1 = (\omega_H - \omega_L) / (\omega_H * \omega_L * R_{ds} * Z_o * B_d)$$

$$L_2 = (\omega_H - \omega_L) / (\omega_H * \omega_L * B_d)$$

$$C_2 = B_d / (\omega_H - \omega_L) - C_{ds}$$

$$B_d = (1/(Z_o * R_{ds}) - 1/(R_{ds} * R_{ds}))^{1/2}$$ (Formulae 7)

As is obvious from the Formulae 7, the two matching angular frequencies $\omega_L$ and $\omega_H$ can be set as individually separate angular frequencies from each other.

The operation of the matching circuit according to the third embodiment of the present invention is as follows.

When a signal from an FET transistor or the like is to be output from the output terminal 2, no reflected wave is generated at least on the basis of the output signal at the two matching frequencies.

As explained hereinabove, since according to the third embodiment of the present invention, an impedance matching operation is performed by a dual-frequency matching circuit which is so configured as comprising the input terminal 1 to which the loads 29 and 30 are connected, the output terminal 2 that outputs an output signal on the basis of the loads 29 and 30, the series resonance circuit, which is composed of the series capacitor 26 and the series inductor 25 connected in series to the series capacitor 26, and disposed in such a manner that it is connected in series to the loads 29 and 30 when observed from the output terminal 2 side, and a parallel resonance circuit, which is composed of the parallel capacitor 28 and the parallel inductor 27 connected in parallel to the parallel capacitor 28, and disposed in such a manner that it is connected to the loads 29 and 30 in parallel when observed from the output terminal 2 side, the matching operation can be performed with an output resistance ($R_{ds}$) of the loads 29 and 30 which is larger than the matching impedance at arbitrarily selected two frequencies.

Particularly, on condition that the resistance of the load resistance 30 is $R_{ds}$, the capacitance of the load capacitor 29 is $C_{ds}$, two matching angular frequencies are $\omega_L$ and $\omega_H$, respectively, and the matching impedance is $Z_0$, since the inductance $L_1$ of the series inductor, the capacitance $C_1$ of the series capacitor, the inductance $L_2$ of the parallel inductor, and the capacitance $C_2$ of the parallel capacitor are set in such a manner as to satisfy the above Formulae 7, the matching operation can be performed optimally at the target matching impedance value.

Further, since there is no need to use a transmission line as each of the inductor 25 and 27, even though the frequency at which the matching operation is performed is set to a low frequency band, a considerably long transmission line is no longer needed, so that the circuit can be minimized when applied in the low frequency band.

Fourth Embodiment

Figure 7:
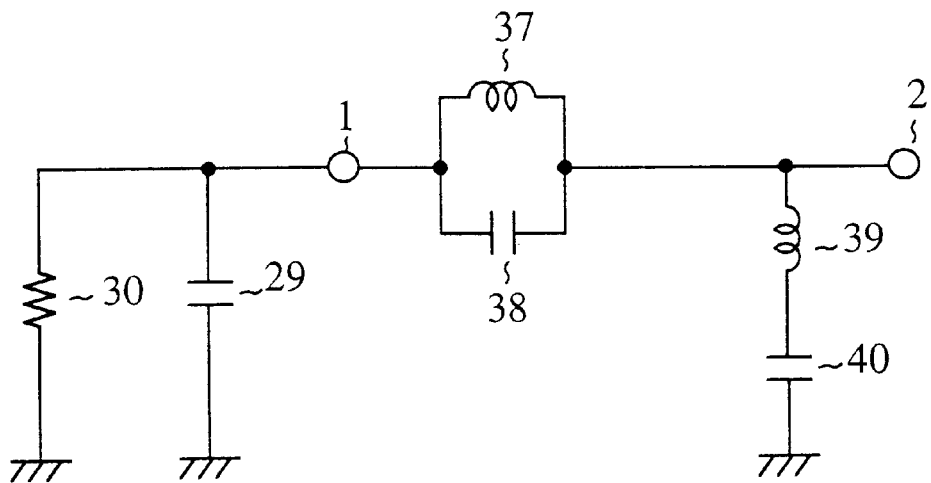
FIG. 7 is a schematic diagram showing a dual-frequency matching circuit according to the fourth embodiment of the present invention and a load connected thereto.

FIG. 7 is a schematic diagram showing a dual-frequency matching circuit and a load connected thereto according to a fourth embodiment of the present invention.

In the figure, reference numeral 37 denotes a parallel inductor disposed between the input terminal 1 and the output terminal 2, numeral 38 denotes a parallel capacitor disposed between the input terminal 1 and the output terminal 2, numeral 39 denotes a series inductor whose one end is connected between the output terminal 2 and the parallel inductor 37, and reference numeral 40 denotes a series capacitor whose one end is connected to the other end of the series inductor 39, while the other end thereof is connected to the ground potential. Other portions are same as those of the third embodiment, so that the detailed explanation thereabout is omitted here by simply putting the same reference numerals. It should be noted that the following explanation of the present embodiment the load resistance 30 is regulated as being smaller than the matching impedance (for example of 50 Ω generally used for a transmission line of a microwave).

Figure 8:
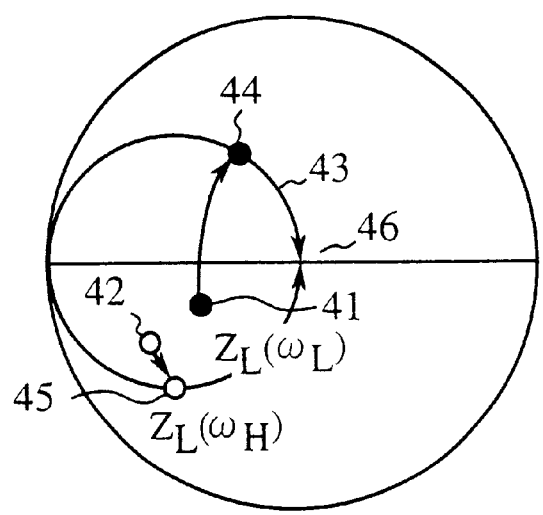
FIG. 8 is a Smith Chart for explaining the role of each of the circuit elements when the matching operation at two angular frequencies $\omega_H$ and $\omega_L$ are carried out in the dual-frequency matching circuit of the fourth embodiment.
Figure 9:
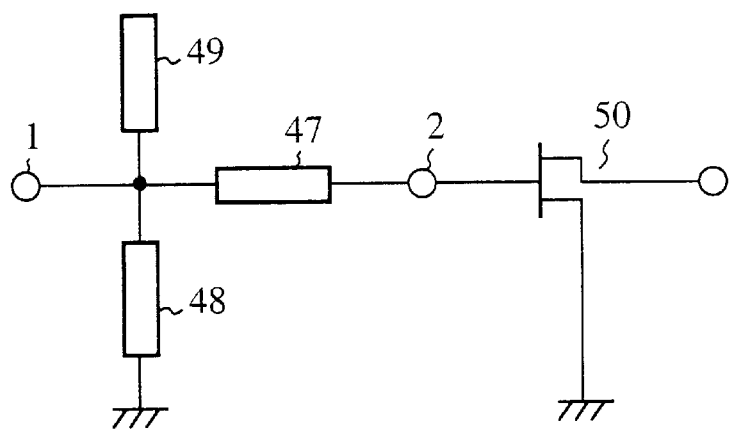
FIG. 9 is a schematic diagram of a conventional dual-frequency matching circuit and an FET transistor connected thereto.
Figure 10:
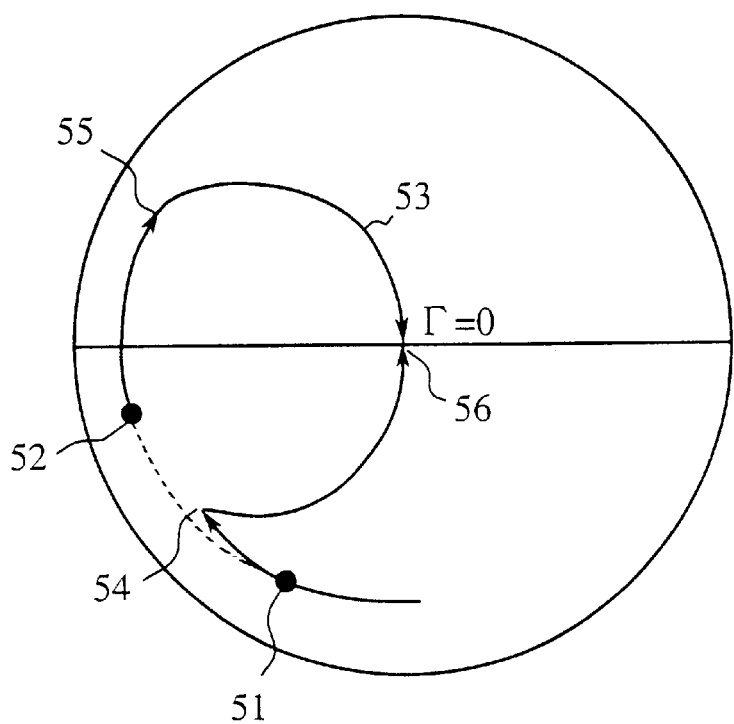
FIG. 10 is a Smith Chart for explaining the matching method in the conventional dual-frequency matching circuit.

FIG. 8 is a Smith Chart for explaining the role of each of the circuit elements shown in FIG. 7, such as the series inductor 39, the series capacitor 40, the parallel inductor 37 and the parallel capacitor 38 when performing an impedance matching operation at two angular frequencies $\omega_H$ and $\omega_L$ in the dual-frequency matching circuit according to the fourth embodiment.

In FIG. 8, reference numeral 41 denotes a load impedance $Z_L(\omega_L)$ in a case that a signal of low angular frequency $\omega_L$ is applied to the load resistance 30 and the load capacitor 29, reference numeral 42 denotes a load impedance $Z_L(\omega_H)$ in a case in that a signal of high angular frequency $\omega_H$ is applied to the load resistance 30 and the load capacitor 29, and reference numeral 43 denotes a constant conductance circle (a constant conductance circle of 0.02 S, for example), which is regulated by the matching impedance.

Here, it is arranged such that the parallel resonance circuit formed by the parallel inductor 37 and the parallel capacitor 38 becomes inductive at a low angular frequency $\omega_L$ and capacitive at a high angular frequency $\omega_H$, and that the two impedances are, due to this, shifted on to the constant conductance circle 43. Reference numeral 44 denotes a thus obtained transformed impedance of the case that a signal of low angular frequency $\omega_L$ is applied, whereas numeral 45 denotes a transformed impedance of the case that a signal of high angular frequency $\omega_H$ is applied, which is also obtained by this operation. The value of the inductance $L_2$ of the parallel inductor $L_2$ and that of the capacitance of the parallel capacitor $C_2$ are shown in the Formulae 8 below.

Further, it is arranged such that the series resonance circuit formed by the series inductor 39 and the series capacitor 40 becomes inductive at a low angular frequency $\omega_L$ and capacitive at a high angular frequency $\omega_H$, and that due to this the two impedances are shifted along the constant conductance circle 43 so as to be matched with each other. Reference numeral 46 denotes a matching point obtained by this matching operation. The value of the inductance $L_1$ of the series inductor and that of the capacitance $C_1$ of the series capacitor are shown also in the Formulae 8 below.

$$L_1 = (\omega_L * \alpha_L * X_{dH} + \omega_H * \alpha_H * X_{dL})/(Y_o * (\omega_H * \omega_H - \omega_L * \omega_L) * X_{dH} * X_{dL})$$

$$C_1 = Y_o * (\omega_H * \omega_H - \omega_L * \omega_L) * X_{dH} * X_{dL}/(\omega_H * \omega_L * (\omega_H * \alpha_L * X_{dH} + \omega_L * \alpha_{dL} * X_{dL}))$$

$$L_2 = (\omega_H * \omega_H - \omega_L * \omega_L)/(\omega_H * \omega_L * (\omega_L/(X_{dH} - \beta_H) + \omega_H/(X_{dL} + \beta_L)))$$

$$C_2 = (\omega_H * (X_{dH} - \beta_H) + \omega_L/(X_{dL} + \beta_L))/(\omega_H * \omega_H - \omega_L * \omega_L)$$

$$\alpha = (1/R_{ds})/(1/(R_{ds} * R_{ds}) + \omega * \omega * C_{ds} * C_{ds})$$

$$\beta = \omega * C_{ds}/(1/R_{ds}R_{ds}) + \omega * \omega * C_{ds} * C_{ds}))$$

$$X_d = (\alpha/Y_o - \alpha * \alpha)^{1/2} \quad \text{(Formulae 8)}$$

As is obvious from the Formulae 8, the two matching angular frequencies $\omega_L$, $\omega_H$ can be set as individually separate angular frequencies from each other.

The operation of the matching circuit according to the present invention is equivalent to that of the third embodiment, so that the detailed explanation thereof is omitted here.

As explained hereinabove, since according to the fourth embodiment of the present invention, an impedance matching operation is performed by a dual-frequency matching circuit which is so configured as comprising an input terminal 1 to which the loads 29 and 30 are connected, an output terminal 2 that outputs an output signal on the basis of the loads 29 and 30, a parallel resonance circuit that is composed of a parallel capacitor 38 and a parallel inductor 37 connected to the parallel capacitor 38, and disposed in such a manner that it is connected in series to the loads 29 and 30 when observed from the output terminal 2 side, and a series resonance circuit that is composed of the series capacitor 40 and the series inductor 39 connected to this series capacitor 40, and disposed in such a manner that it is connected in parallel to the entire portion of the loads 29 and 30 and the parallel resonance circuit formed by the circuit elements 37 and 38 when observed from the output terminal 2 side, the matching operation can be performed with an output resistance ($R_{ds}$) of the loads 29 and 30 which is smaller than the matching impedance at arbitrarily selected two frequencies.

Particularly, on condition that the resistance of the load resistance 30 is $R_{ds}$ the capacitance of the load capacitor 29 is $C_{ds}$, two matching angular frequencies are $\omega_L$ and $\omega_H$, respectively, and the matching admittance is $Y_0$, since the inductance $L_1$ of the series inductor, the capacitance $C_1$ of the series capacitor, the inductance $L_2$ of the parallel inductor, and the capacitance $C_2$ of the parallel capacitor are set in such a manner as to satisfy the above Formulae 8, the matching operation can be performed optimally at the target matching impedance value.

Further, since there is no need to use a transmission line as each of the inductor 37 and 39, even though the frequency at which the matching operation is performed is set to a low frequency band, a considerably long transmission line is no longer needed, so that the circuit can be minimized when applied in the low frequency band.

As is explained heretofore, since the dual-frequency matching circuit according to the present invention comprises an output terminal to which a load is connected, an input terminal through which an input signal is input to the load, a series resonance circuit, which is composed of a series capacitor and a series inductor connected in series to the series capacitor and disposed in such a manner as to be connected in series to the load when observed from the input terminal side, and a parallel resonance circuit, which is composed of a parallel capacitor and a parallel inductor connected in parallel to the parallel capacitor, and disposed in such a manner as to be connected in parallel to the entire portion of the series resonance circuit and the load when observed from the input terminal side, the matching operation can be performed with an input resistance (Ri) of the load which is smaller than the matching impedance at arbitrarily selected two frequencies. Further, since there is no need to use a transmission line as one of the matching elements, even though the frequency at which the matching operation is performed is set to a low frequency band, a considerably long transmission line is no longer needed, so that the circuit can be minimized when applied in the low frequency band.

Since the dual-frequency matching circuit according to the present invention comprises an output terminal to which the load is connected, an input terminal 1 through which an input signal to the load is input, a parallel resonance circuit, which is composed of a parallel capacitor and a parallel inductor connected in parallel to the parallel capacitor and disposed in such a manner as to be connected in series to the loads and when observed from the input terminal side, and a series resonance circuit, which is composed of a series capacitor and a series inductor connected in series to the series capacitor, and disposed in such a manner as to be connected in parallel to the load when observed from the input terminal side, the matching operation can be performed with an input resistance (Ri) of the load which is larger than the matching impedance at arbitrarily selected two frequencies. Further, since there is no need to use a transmission line as each of the inductor, even though the frequency at which the matching operation is performed is set to a low frequency band, a considerably long transmission line is no longer needed, so that the circuit can be minimized when applied in the low frequency band.

Since the dual-frequency matching circuit according to the present invention comprises an input terminal through which the total load is connected, an output terminal that outputs an output signal on the basis of the load, a series resonance circuit, which is composed of a series capacitor and a series inductor connected to the series capacitor and disposed in such a manner as to be connected in series to the load and when observed from the output terminal side, and a parallel resonance circuit, which is composed of the parallel capacitor and the parallel inductor connected in series to the parallel capacitor and disposed in such a manner as to be connected in parallel with the load when observed from the output terminal side, the matching operation can be performed with an output resistance ($R_{ds}$) of the load which is larger than the matching impedance at arbitrarily selected two frequencies. Further, since there is no need to use a transmission line as each of the inductor, even though the frequency at which the matching operation is performed is set to a low frequency band, a considerably long transmission line is no longer needed, so that the circuit can be minimized when applied in the low frequency band.

Since the dual-frequency matching circuit according to the present invention comprises an input terminal through which the total load is connected, an output terminal that outputs an output signal on the basis of the load, a parallel resonance circuit, which is composed of a parallel capacitor and a parallel inductor connected to the parallel capacitor and disposed in such a manner as to be connected in series to the load when observed from the output terminal side, and a series resonance circuit, which is composed of the series capacitor and the series inductor and disposed in such a manner as to be connected in parallel to the entire portion of the load and the parallel resonance circuit when observed from the output terminal side, the matching operation can be performed with an input resistance ($R_{ds}$) of the load which is larger than the matching impedance at arbitrarily selected two frequencies. Further, since there is no need to use a transmission line as each of the inductor, even though the frequency at which the matching operation is performed is set to a low frequency band, a considerably long transmission line is no longer needed, so that the circuit can be minimized when applied in the low frequency band.

What is claimed is:

1. A dual-frequency impedance matching circuit for exhibiting an equal impedance to two input signals of two different and arbitrarily selected frequencies, comprising:
    a first series resonant LC circuit and a second parallel resonant LC circuit, connected between an input terminal at which an input signal is inputted, and an output terminal at which said input signal is outputted, wherein the values of the inductors and the capacitors of said LC circuits are chosen such that the impedance of said matching circuit seen by a first input signal of a low angular frequency $\omega_L$ is substantially the same as the impedance of said matching circuit seen by a second input signal of a high angular frequency $\omega_H$.

2. A dual-frequency matching circuit comprising:
    an output terminal to which a load is connected;
    an input terminal through which an input signal is inputted to the load;
    a series resonance circuit, which is composed of a series capacitor and a series inductor connected in series to said series capacitor, and being connected in series to the load when observed from said input terminal; and
    a parallel resonance circuit, which is composed of a parallel capacitor and a parallel inductor connected in parallel to said parallel capacitor, and being connected in parallel to the entire portion of said load and said series resonance circuit when observed from said input terminal; wherein
        the impedance of said matching circuit seen by a first input signal of a low angular frequency $\omega_L$ is substantially the same as the impedance of said matching circuit seen by a second input signal of a high angular frequency $\omega_H$.

3. A dual-frequency matching circuit according to claim 2, wherein said series resonance circuit formed by said series capacitor and said series inductor becomes inductive at two angular frequencies, and wherein said parallel resonance circuit formed by said parallel capacitor and said parallel inductor becomes inductive at a low angular frequency $\omega_L$ and capacitive at a high angular frequency $\omega_H$.

4. A dual-frequency matching circuit according to claim 2, wherein said load comprises an FET transistor.

5. A dual-frequency matching circuit according to claim 2, wherein said load is formed by a load resistor and a load capacitor mutually connected in series, the resistance of said load resistance is $R_i$, the capacitance of said load capacitor is $C_{gs}$, two matching angular frequencies are $\omega_L$ and $\omega_H$, respectively, and matching admittance is $Y_0$, the inductance $L_1$ of said series inductor, and the capacitance $C_1$ of said series capacitor, the inductance $L_2$ of said parallel inductor, and the capacitance $C_2$ of said parallel capacitor are set in such a manner as to satisfy the following formulae:

$$L_1 = X_g/(\omega_H - \omega_L)$$

$$C_1 = (\omega_H - \omega_L) * C_{gs}/(C_{gs} * \omega_H * \omega_L * X_g - (\omega_H - \omega_L))$$

$$L_2 = (\omega_H - \omega_L) * R_i/(\omega_H * \omega_L * Y_0 * X_g)$$

$$C_2 = Y_0 * X_g/((\omega_H - \omega_L) * R_i)$$

$$X_g = (R_i Y_0 - R_i * R_i)^{1/2}.$$

6. A dual-frequency matching circuit comprising:
    an output terminal to which a load is connected;
    an input terminal through which an input signal is inputted to the load;
    a parallel resonance circuit, which is composed of a parallel capacitor and a parallel inductor connected in parallel to said parallel capacitor, and being connected in series to the load when observed from said input terminal; and
    a series resonance circuit, which is composed of a series capacitor and a series inductor connected in series to said series capacitor, and being connected in parallel to the load when observed from said input terminal; wherein
        the impedance of said matching circuit seen by a first input signal of a low angular frequency $\omega_L$ is substantially the same as the impedance of said matching circuit seen by a second input signal of a high angular frequency $\omega_H$.

7. A dual-frequency matching circuit according to claim 6, wherein said series resonance circuit formed by said series capacitor and said series inductor becomes inductive at a low angular frequency $\omega_L$ and capacitive at a high angular frequency $\omega_H$, and wherein said parallel resonance circuit formed by said parallel capacitor and said parallel inductor becomes inductive at a low angular frequency $\omega_L$ and capacitive at a high angular frequency $\omega_H$.

8. A dual-frequency matching circuit according to claim 6, wherein said load comprises an FET transistor.

9. A dual-frequency matching circuit according to claim 6, wherein said load is formed by a load resistor and a load capacitor mutually connected in series, the resistance of the load resistance is $R_i$, the capacitance of the load capacitor is $C_{gs}$, two matching angular frequencies are $\omega_L$ and $\omega_H$, respectively, and a matching impedance is $Z_0$, the inductance $L_1$ of said series inductor, the capacitance $C_1$ of said series capacitor, the inductance $L_2$ of said parallel inductor, and the capacitance $C_2$ of said parallel capacitor are set in such a manner as to satisfy the following formulae:

$$L_1 = (\omega_H*(\beta_L - B_{gL}) - \omega_L*(\beta_H + B_{gH})) / ((\omega_H*\omega_H - \omega_L*\omega_L)(\beta_L - B_{gL})(\beta_H + B_{gH}))$$

$$C_1 = (\omega_H*\omega_H - \omega_L*\omega_L)(\beta_L - B_{gL})(\beta_H + B_{gH}) / (\omega_H*\omega_L*(\omega_L*(\beta_L - B_{gL}) - \omega_H*(\beta_H + B_{gH})))$$

$$L_2 = Z_0*(\omega_H*\omega_H - \omega_L*\omega_L)*B_{gH}*B_{gL} / (\omega_H*\omega_L*(\omega_H*\alpha_L*B_{gH} + \omega_L*\alpha_H*B_{gL}))$$

$$C_2 = (\omega_L*\alpha_L*B_{gH} + \omega_H*\alpha_H*B_{gL}) / (Z_0*(\omega_H*\omega_H - \omega_L*\omega_L)*B_{gH}*B_{gL})$$

$$\alpha = R_i/(R_i*R_i + 1/(\omega*\omega*C_{gs}*C_{gs}))$$

$$\beta = (1/(\omega*C_{gs}))/(R_i*R_i + 1/(\omega*\omega*C_{gs}*C_{gs}))$$

$$B_g = (\alpha/Z_0 - \alpha*\alpha)^{1/2}.$$

10. A dual-frequency matching circuit comprising:
an input terminal to which a load is connected;
an output terminal that outputs an output signal on the basis of the load;
a series resonance circuit, which is composed of a series capacitor and a series inductor connected in series to said series capacitor, and being connected in series to the load when observed from said output terminal; and
a parallel resonance circuit, which is composed of a parallel capacitor and a parallel inductor connected in parallel to said parallel capacitor, and being connected in parallel to the load when observed from said output terminal; wherein
the impedance of said matching circuit seen by a first input signal of a low angular frequency $\omega_L$ is substantially the same as the impedance of said matching circuit seen by a second input signal of a high angular frequency $\omega_H$.

11. A dual-frequency matching circuit according to claim 10, wherein said parallel resonance circuit formed by said parallel capacitor and said parallel inductor becomes inductive at a low angular frequency $\omega_L$ and capacitive at a high angular frequency $\omega_H$, and wherein said series resonance circuit formed by said series capacitor and said series inductor becomes inductive at a low angular frequency $\omega_L$ and capacitive at a high angular frequency $\omega_H$.

12. A dual-frequency matching circuit according to claim 10, wherein said load comprises an FET transistor.

13. A dual-frequency matching circuit according to claim 10, wherein said load is formed by a load capacitor and a load resistor mutually connected in parallel, one end of both said load capacitor and load resistor being connected to the input terminal in series, wherein the resistance of said load resistance is $R_1$, the capacitance of the load capacitor is $C_{gs}$, two matching angular frequencies are $\omega_L$ and $\omega_H$, respectively, and a matching admittance is $Y_0$, the inductance of said series inductor is $L_1$, the capacitance of said series capacitor is $C_1$, the inductance of said parallel inductor is $L_2$, and the capacitance of said parallel capacitor is $C_2$, and are set in such a manner as to satisfy the following formulae:

$$L_1 = R_{ds}*Z_0*B_d/(\omega_H - \omega_L)$$

$$C_1 = (\omega_H - \omega_L)/(\omega_H*\omega_L*R_{ds}*Z_0*B_d)$$

$$L_2 = (\omega_H - \omega_L)/(\omega_H*\omega_L*B_d)$$

$$C_2 = B_d/(\omega_H - \omega_L) - C_{ds}$$

$$B_d = (1/(Z_0*R_{ds}) - 1/(R_{ds}*R_{ds}))^{1/2}.$$

14. A dual-frequency matching circuit comprising:
an input terminal to which a load is connected;
an output terminal that outputs an output signal on the basis of the load;
a parallel resonance circuit, which is composed of a parallel capacitor and a parallel inductor connected in parallel to said parallel capacitor, and being connected in series to the load when observed from said output terminal; and
a series resonance circuit, which is composed of a series capacitor and a series inductor connected in series to said series capacitor, and being connected in parallel to the load and to said parallel resonance circuit when observed from the output terminal; wherein
the impedance of said matching circuit seen by a first input signal of a low angular frequency $\omega_L$ is substantially the same as the impedance of said matching circuit seen by a second input signal of a high angular frequency $\omega_H$.

15. A dual-frequency matching circuit according to claim 14, wherein said parallel resonance circuit formed by said parallel capacitor and said parallel inductor becomes inductive at a low angular frequency $\omega_L$ and capacitive at a high angular frequency $\omega_H$, and wherein said series resonance circuit formed by said series capacitor and said series inductor becomes inductive at a low angular frequency $\omega_L$ and capacitive at a high angular frequency $\omega_H$.

16. A dual-frequency matching circuit according to claim 14, wherein said load comprises an FET transistor.

17. A dual-frequency matching circuit according to claim 14, wherein said load is formed by a load capacitor and a load resistor mutually connected in parallel, one end of said both load capacitor and load resistor being connected to the input terminal in series, the resistance of said load resistance is $R_i$, the capacitance of the load capacitor is $C_{gs}$, two matching angular frequencies are $\omega_L$ and $\omega_H$, respectively, and a matching admittance is $Y_0$, the inductance of said series inductor is $L_1$, the capacitance of said series capacitor is $C_1$, the inductance of said parallel inductor is $L_2$, and the capacitance of said parallel capacitor is $C_2$, and are set in such a manner as to satisfy the following formulae:

$$L_1 = (\omega_L*\alpha_L*X_{dH} + \omega_H*\alpha_H*X_{dL})/(Y_0*(\omega_H*\omega_H - \omega_L*\omega_L)*X_{dH}*X_{dL})$$

$$C_1 = Y_0*(\omega_H*\omega_H - \omega_L*\omega_L)*X_{dH}*X_{dL}/(\omega_H*\omega_L*(\omega_H*\alpha_L*X_{dH} + \omega_L*\alpha_{dL}*X_{dL}))$$

$L_2=(\omega_H*\omega_H-\omega_L*\omega_L)/(\omega_H*\omega_L*(\omega_L/(X_{dH}-\beta_H)+\omega_H/(X_{dL}+\beta_L)))$ $C_2=(\omega_H*(X_{dH}-\beta_H)+\omega_L/(X_{dL}+\beta_L))/(\omega_H*\omega_H-\omega_L*\omega_L)$ $\alpha=(1/R_{ds})/(1/(R_{ds}*R_{ds})+\omega*\omega*C_{ds}*C_{ds})$ $\beta=\omega*C_{ds}/(1/(R_{ds}*R_{ds})+\omega*\omega*C_{ds}*C_{ds}))$ $X_d=(\alpha/Y_0-\alpha*\alpha)^{1/2}.$

\* \* \* \* \*

UNITED STATES PATENT AND TRADEMARK OFFICE
CERTIFICATE OF CORRECTION

PATENT NO. : 6,331,815 B1
DATED : December 18, 2001
INVENTOR(S) : Takeshi Oshima et al.

It is certified that error appears in the above-identified patent and that said Letters Patent is hereby corrected as shown below:

Column 1,
Line 59, "EFT" should be -- FET --.

Column 4,
Line 28, in the formula, the line starting with "α", before the second "R" insert an open parenthesis -- ( --.

Column 8,
Line 4, "$\omega_L$" should read -- $\omega_L$ --.
Line 8, in the formula, the line starting with "α" delete the first open parenthesis "(" and insert an open parenthesis -- ( -- before the second "R" in the same line.

Column 11,
Line 57, in the formula, the line starting with "β" insert an open parenthesis before the first "R".

Signed and Sealed this

Sixteenth Day of March, 2004

JON W. DUDAS
*Acting Director of the United States Patent and Trademark Office*